United States Patent
Watanabe et al.

(10) Patent No.: US 9,093,347 B2
(45) Date of Patent: Jul. 28, 2015

(54) DETECTING APPARATUS AND DETECTING SYSTEM

(71) Applicant: CANON KABUSHIKI KAISHA, Tokyo (JP)

(72) Inventors: Minoru Watanabe, Honjo (JP); Keigo Yokoyama, Honjo (JP); Masato Ofuji, Takasaki (JP); Jun Kawanabe, Kumagaya (JP); Kentaro Fujiyoshi, Tokyo (JP); Hiroshi Wayama, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/276,510

(22) Filed: May 13, 2014

(65) Prior Publication Data

US 2014/0339431 A1     Nov. 20, 2014

(30) Foreign Application Priority Data

May 15, 2013   (JP) .................................. 2013-103325
May 15, 2013   (JP) .................................. 2013-103327

(51) Int. Cl.
*H01L 27/146* (2006.01)

(52) U.S. Cl.
CPC .............................. *H01L 27/14663* (2013.01)

(58) Field of Classification Search
CPC ............ H01L 27/146; H01L 27/14643; H01L 27/14665; G01T 1/208
See application file for complete search history.

(56) References Cited

U.S. PATENT DOCUMENTS

| | | | |
|---|---|---|---|
| 2009/0230443 A1* | 9/2009 | Mochizuki et al. | 257/292 |
| 2011/0079780 A1* | 4/2011 | Yamayoshi et al. | 257/57 |
| 2012/0261581 A1* | 10/2012 | Fujiyoshi et al. | 250/361 R |
| 2013/0043400 A1* | 2/2013 | Nakatsugawa et al. | 250/366 |

FOREIGN PATENT DOCUMENTS

| | | |
|---|---|---|
| JP | 2002-026300 A | 1/2002 |
| JP | 2007-329434 A | 12/2007 |

* cited by examiner

*Primary Examiner* — Marcus Taningco
(74) *Attorney, Agent, or Firm* — Canon USA, Inc. IP Division

(57) ABSTRACT

A detecting apparatus includes a substrate that permits visible light to pass therethrough, a converting element that includes a pixel electrode, an impurity semiconductor layer, and a semiconductor layer arranged in that order from a side adjacent to the substrate and is configured to convert radiation or light into charge, and a light source configured to emit the visible light through the substrate to the converting element. The pixel electrode includes a metal layer that permits the visible light to pass therethrough.

19 Claims, 15 Drawing Sheets

DETECTING APPARATUS AND DETECTING SYSTEM

BACKGROUND OF THE INVENTION

1. Field of the Invention

One disclosed aspect of the embodiments relates to a detecting apparatus applied to, for example, a medical diagnostic imaging apparatus, a nondestructive inspection apparatus, or an analysis apparatus using radiation, and a detecting system.

2. Description of the Related Art

Thin film semiconductor producing techniques have been used to make detecting apparatuses that include an array (pixel array) of pixels each including a combination of a switching element, such as a thin film transistor (TFT), and a converting element, such as a photodiode, for converting radiation or light into charge. Japanese Patent Laid-Open No. 2002-026300 discloses a related-art detecting apparatus which includes a switching element disposed on a substrate, a converting element disposed over the switching element and electrically connected thereto, and an interlayer insulating layer disposed between the converting element and each of the substrate and the switching element. This converting element includes a pixel electrode electrically connected to the switching element, a counter electrode disposed opposite the pixel electrode, a semiconductor layer disposed between the pixel electrode and the counter electrode, and an impurity semiconductor layer disposed between the pixel electrode and the semiconductor layer. The pixel electrode includes transparent conductive oxide in order to achieve efficient light irradiation for after-image reduction. Japanese Patent Laid-Open No. 2007-329434 discloses a related-art radiation imaging apparatus which includes a pixel electrode having a gap in a region where a semiconductor layer is disposed in order to achieve efficient light irradiation for after-image reduction.

A disadvantage of the structure disclosed in Japanese Patent Laid-Open No. 2002-026300 is incompatibility between adhesion of the impurity semiconductor layer to the transparent conductive oxide and dark current characteristics of the converting element. As the adhesion between the impurity semiconductor layer and the transparent conductive oxide is improved, the dark current characteristics of the converting element are degraded. On the other hand, as the dark current characteristics of the converting element are improved, the adhesion between the impurity semiconductor layer and the transparent conductive oxide is degraded. As regards the structure disclosed in Japanese Patent Laid-Open No. 2007-329434, the gap in the pixel electrode increases connection resistance between the converting element and the switching element. Unfortunately, it may be difficult to ensure a transfer rate enough to yield a frame rate of, for example, 30 fps.

SUMMARY OF THE INVENTION

One disclosed aspect of the embodiments provides a detecting apparatus capable of exhibiting good adhesion between an impurity semiconductor layer and a pixel electrode, allowing a converting element to have good dark current characteristics, and ensuring a good transfer rate. According to an aspect of the embodiments, a detecting apparatus includes a substrate that permits visible light to pass therethrough, a converting element that includes a pixel electrode, an impurity semiconductor layer, and a semiconductor layer arranged in that order from a side adjacent to the substrate and is configured to convert radiation or light into charge, and a light source configured to emit the visible light through the substrate to the converting element. The pixel electrode includes a metal layer that permits the visible light to pass therethrough. According to another aspect of the embodiments, a detecting system includes the detecting apparatus, a signal processing unit configured to process a signal from the detecting apparatus, a recording unit configured to record a signal from the signal processing unit, a display unit configured to display the signal from the signal processing unit, and a transmission unit configured to transmit the signal from the signal processing unit.

Further features of the disclosure will become apparent from the following description of exemplary embodiments with reference to the attached drawings.

DESCRIPTION OF THE EMBODIMENTS

Embodiments of the disclosure will be described in detail below with reference to the attached drawings. The term "radiation" used herein includes not only alpha rays, beta rays, and gamma rays that are beams formed of particles (including photons) emitted by radioactive decay, but also beams having power similar to or higher than those of the above-described beams, for example, X-rays, particle beams, and cosmic rays.

First Embodiment

Figure 1A:
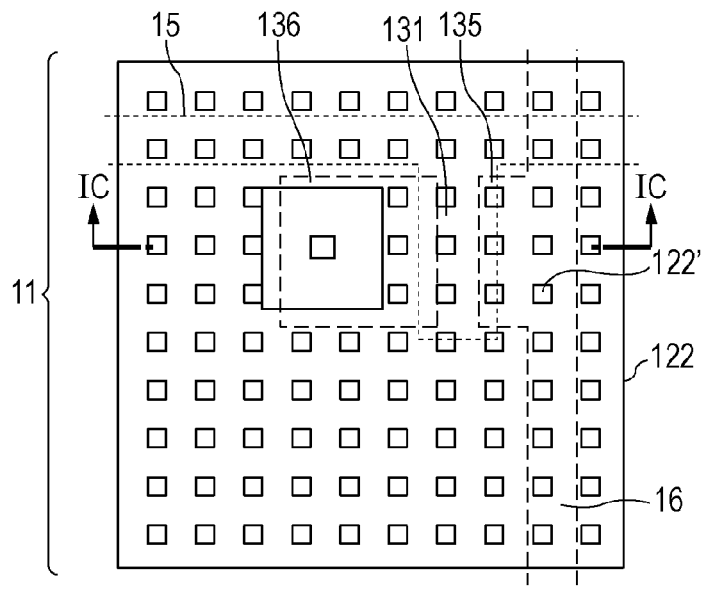
FIG. 1A is a schematic plan view of each pixel of a detecting apparatus according to a first embodiment.
Figure 1B:
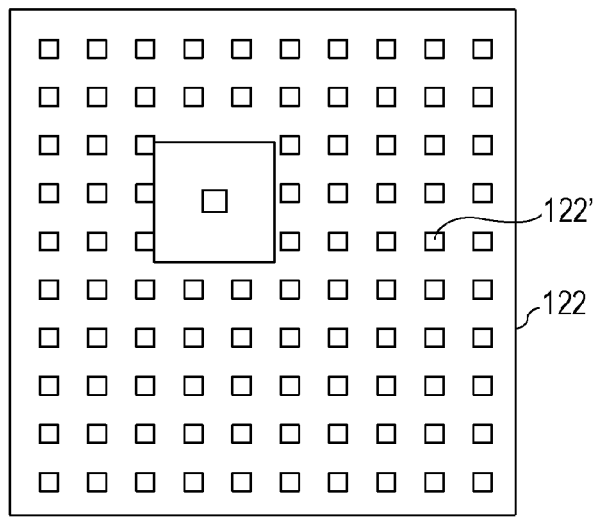
FIG. 1B is a schematic plan view of a pixel electrode of the pixel of the detecting apparatus according to the first embodiment.
Figure 1C:
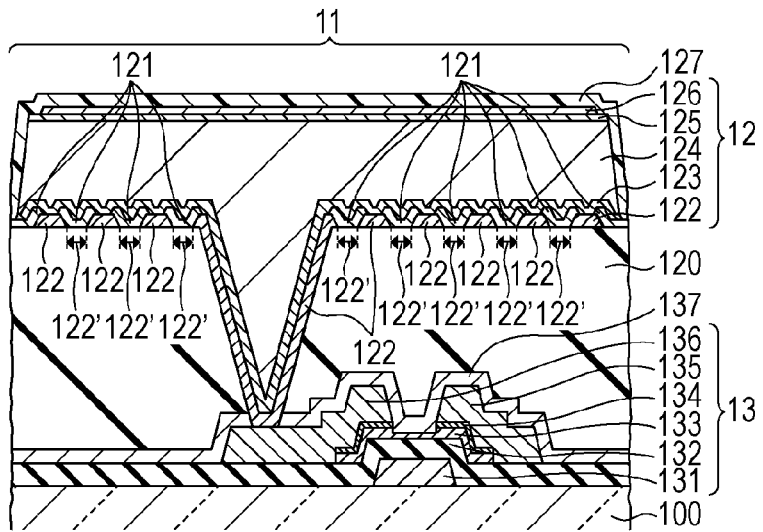
FIG. 1C is a schematic cross-sectional view of the pixel of the detecting apparatus according to the first embodiment.

A detecting apparatus according to a first embodiment will be described with reference to FIGS. 1A to 1C. FIG. 1A is a schematic plan view of each pixel included in the detecting apparatus. FIG. 1B is a schematic plan view of a pixel electrode included in each pixel. FIG. 1C is a schematic cross-sectional view of the pixel taken along the line IC-IC of FIG. 1A. In FIG. 1A, insulating layers, covering members, semiconductor layers, and impurity semiconductor layers which will be described later are omitted for simplicity.

The detecting apparatus includes an array of pixels 11 on a first surface of a substrate 100. As illustrated in FIGS. 1A to 1C, each pixel 11 includes a converting element 12 to convert radiation or light into charge and a thin film transistor (TFT) 13, serving as a switching element, to output an electrical signal depending on the charge in the converting element 12. In this embodiment, the converting element 12 is a PIN photodiode of amorphous silicon. The converting element 12 is disposed over the TFT 13 disposed on the insulating substrate 100, such as a glass substrate, such that an interlayer insulating layer 120 formed of an organic material is disposed between the converting element 12 and the TFT 13. The interlayer insulating layer 120 overlies a plurality of TFTs 13, serving as a plurality of switching elements. As illustrated in FIG. 1C, the interlayer insulating layer 120 is covered with covering members 121 formed of an inorganic material and a pixel electrode 122.

The TFT 13 includes on the substrate 100 a control electrode 131, an insulating layer 132, a semiconductor layer 133, an impurity semiconductor layer 134 having a higher impurity concentration than the semiconductor layer 133, and a first main electrode 135 and a second main electrode 136 arranged in that order from the substrate side. The impurity semiconductor layer 134 is partly in contact with the first main electrode 135 and the second main electrode 136. A part of the semiconductor layer 133 between the parts of the impurity semiconductor layer 134 in contact with the first and second main electrodes 135 and 136 serves as a TFT channel region. The control electrode 131 is electrically connected to a control line 15, the first main electrode 135 is electrically connected to a signal line 16, and the second main electrode 136 is electrically connected to the pixel electrode 122 of the converting element 12. In this embodiment, the first main electrode 135, the second main electrode 136, and the signal line 16 are integrally formed using the same conductive layer. The first main electrode 135 serves as part of the signal line 16. A protection layer 137 is disposed so as to overlie the TFT 13, the control line 15, and the signal line 16. Although the switching element in this embodiment is an inversely staggered TFT which includes amorphous silicon as a main component and includes the semiconductor layer 133 and the impurity semiconductor layer 134, the disclosure is not limited to this example. For example, a staggered TFT including polycrystalline silicon as a main component, an organic TFT, or an oxide TFT may be used. In this embodiment, the control electrode 131 and the control line 15 are integrally formed using the same conductive layer. In addition, the first main electrode 135 and the signal line 16 are integrally formed using the same conductive layer.

The interlayer insulating layer 120 is disposed between the substrate 100 and the pixel electrodes 122 of the converting elements 12, which will be described later, such that the TFTs 13 are covered with the interlayer insulating layer 120. The interlayer insulating layer 120 has contact holes. In each contact hole of the interlayer insulating layer 120, the second main electrode 136 of the TFT 13 is electrically connected to the pixel electrode 122 of the converting element 12.

The converting element 12 includes on the interlayer insulating layer 120 a metal layer 122, serving as the pixel electrode, a first conductivity type impurity semiconductor layer 123, a semiconductor layer 124, a second conductivity type impurity semiconductor layer 125, and a counter electrode 126 arranged in that order from the interlayer insulating layer (or the substrate) side. The pixel electrode includes the metal layer 122 formed of metal or alloy. The metal may be selected from Al ($2.655 \times 10^{-6}$ Ωcm), Mo ($5.0 \times 10^{-8}$ Ωcm), Cr ($1.29 \times 10^{-5}$ Ωcm), Ti ($4.2 \times 10^{-5}$ Ωcm), W ($5.65 \times 10^{-6}$ Ωcm), and Cu ($1.67 \times 10^{-6}$ Ωcm). For the alloy, an Al alloy, such as Al—Nd ($5.0 \times 10^{-8}$ Ωcm), may be used. Such a metal or alloy has higher resistance to plasma, used in plasma chemical vapor deposition (CVD) for forming the first conductivity type impurity semiconductor layer 123, than transparent conductive oxide used in Japanese Patent Laid-Open No. 2002-026300. Accordingly, the metal layer 122 can be less damaged by plasma CVD than a transparent conductive oxide layer and exhibit higher adhesion to the first conductivity type impurity semiconductor layer 123 than the transparent conductive oxide layer. Furthermore, the metal layer 122 has better surface smoothness than transparent conductive oxide. Accordingly, the first conductivity type impurity semiconductor layer 123 in contact with the metal layer 122 may have less lattice defects than an impurity semiconductor layer in contact with transparent conductive oxide. Consequently, the first conductivity type impurity semiconductor layer 123 in contact with the metal layer 122 can contain impurities at a higher concentration than an impurity semiconductor layer in contact with transparent conductive oxide, thus reducing reverse saturation current in the reverse-biased PIN photodiode, or dark current. The metal layer 122 hardly allows visible light emitted from a light source (not illustrated) which may be disposed on a second surface of the substrate 100 opposite the first surface on which the pixels 11 are arranged to sufficiently pass through the metal layer 122 to the semiconductor layer 124 for after-image reduction. Accordingly, the metal layer 122 has gaps 122' arranged in a portion (region) on which an orthogonal projection of the semiconductor layer 124 is superposed. The orthogonal projection of the semiconductor layer 124 is obtained by orthogonally projecting the semiconductor layer 124 onto the metal layer 122. Since the metal layer 122 has the gaps 122', the semiconductor layer 124 can be sufficiently irradiated with light from the light source (not illustrated) through the gaps 122'. The above-described metal or alloy has a lower resistivity than transparent conductive oxide (having a resistivity up to $2.0 \times 10^{-4}$ Ωcm). Thus, the resistance of the metal layer 122 can be easily suppressed to a sufficiently low level so that the metal layer having the gaps 122' can be used as a pixel electrode. Consequently, a sufficient pixel transfer rate can be easily ensured. As described above, the use of the metal layer 122 having the gaps 122' in the region where the semiconductor layer 124 is disposed can provide a detecting apparatus capable of exhibiting good adhesion between an impurity semiconductor layer and a pixel electrode, allowing a converting element to have good dark current characteristics, and ensuring a good transfer rate. The first conductivity type impurity semiconductor layer 123 has a polarity of the first conductivity type and a higher concentration of impurities of the first conductivity type than the semiconductor layer 124 and the second conductivity type impurity semiconductor layer 125. The second conductivity type impurity semiconductor layer 125 has a polarity of the second conductivity type and has a higher concentration of impurities of the second conductivity type than the first conductivity type impurity semiconductor layer 123 and the semiconductor layer 124. The second conductivity type impurity semiconductor layer 125 corresponds to another impurity semiconductor layer in the disclosure. The polarity of the first conductivity type is opposite to that of the second conductivity type. In this embodiment, the first conductivity type is n-type and the second conductivity type is p-type. The disclosure is not limited to this example. The first conductivity type may be p-type and the second conductivity type may be n-type. The counter electrode 126 of the converting element 12 is electrically connected to an electrode line (not illustrated). The metal layer 122, serving as the pixel electrode, is electrically connected to the second main electrode 136 of the TFT 13 in the contact hole provided in the interlayer insulating layer 120. This embodiment uses the photodiode which includes amorphous silicon as a main component and includes the first conductivity type impurity semiconductor layer 123, the semiconductor layer 124, and the second conductivity type impurity semiconductor layer 125. In this embodiment, the interlayer insulating layer 120 is covered with the metal layer 122 and the covering members 121 formed of the inorganic material. Specifically, the covering member 121 is disposed between the interlayer insulating layer 120 and the first conductivity type impurity semiconductor layer 123 in each of the gaps 122' of the metal layer 122 and in each area between the pixel electrodes of the adjacent pixels 11. Accordingly, the interlayer insulating layer 120 can be prevented from being exposed while an impurity semiconductor film to be the impurity semiconductor layer 123 is formed by CVD, vapor deposition, or sputtering. This prevents the organic material from being mixed into the impurity semiconductor layer 123. In this embodiment, the impurity semiconductor layer 123, the semiconductor layer 124, and the impurity semiconductor layer 125 are separated for each pixel such that the layers arranged between the adjacent pixels are removed on the covering member 121. The covering member 121 functions as an etching stopper layer during separation or removal. Consequently, the interlayer insulating layer 120 can be protected against exposure to species for dry etching, thus preventing the converting element from being contaminated with the organic material. Although the covering members 121 are arranged between the impurity semiconductor layer 123 and each of the interlayer insulating layer 120 and the metal layer 122 in FIG. 1C, the covering members 121 may be arranged between the interlayer insulating layer 120 and each of the metal layer 122 and the impurity semiconductor layer 123.

The converting element 12 and the covering members 121 are covered with a passivation layer 127.

Although this embodiment uses the photodiode which includes amorphous silicon as a main component and includes the first conductivity type impurity semiconductor layer 123, the semiconductor layer 124, and the second conductivity type impurity semiconductor layer 125, the disclosure is not limited to this example. An element that converts radiation directly into charge, includes, for example, amorphous selenium as a main component, and includes the first conductivity type impurity semiconductor layer 123, the semiconductor layer 124, and the second conductivity type impurity semiconductor layer 125 may be used. The counter electrode 126 is disposed opposite the metal layer 122, serving as the pixel electrode, and is electrically connected to the electrode line (not illustrated). In the use of the photodiode which includes amorphous silicon as a main component and includes the first conductivity type impurity semiconductor layer 123, the semiconductor layer 124, and the second conductivity type impurity semiconductor layer 125, the counter electrode 126 may be formed of transparent conductive oxide, which successfully allows light from a scintillator (not illustrated) for wavelength-converting radiation into visible light to pass through the counter electrode 126 to the semiconductor layer 124.

Figure 2A:
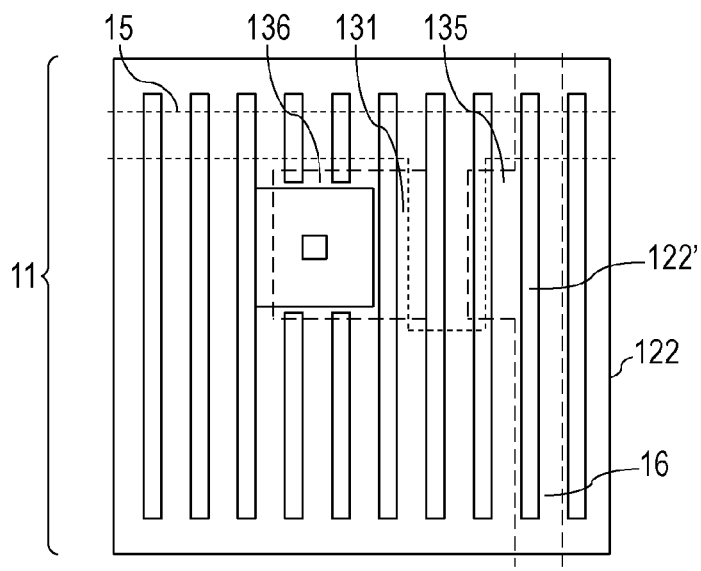
FIGS. 2A, 2B, and 2C are schematic plan views each illustrating each pixel of a detecting apparatus according to a modification of the first embodiment.
Figure 2B:
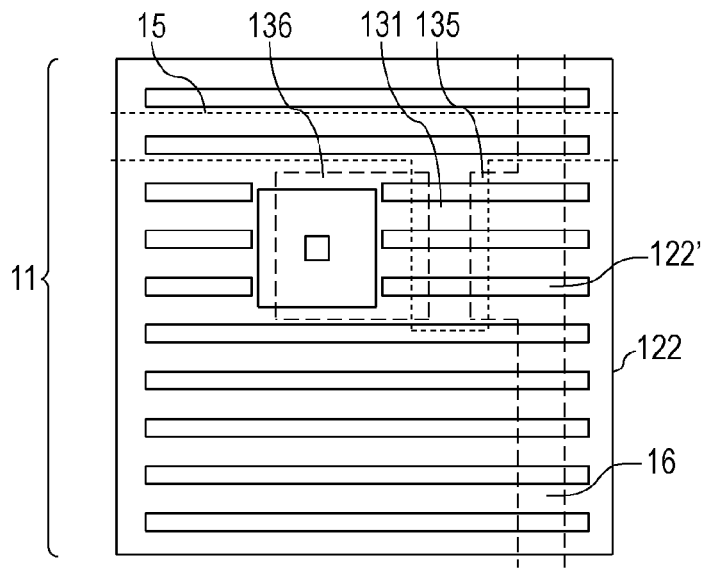
Figure 2C:
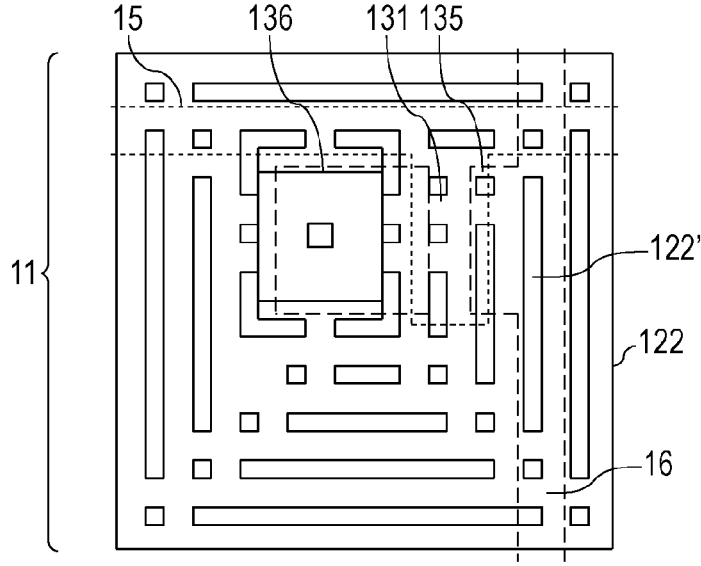

In this embodiment, the metal layer 122 other than a portion in the contact hole has the gaps 122', which are square-shaped, arranged in a two-dimensional array. If the gaps 122' are arranged in the portion of the metal layer 122 in the contact hole, the contact resistance between the converting element 12 and the TFT 13 may be increased or a connection failure may be caused. The shape of the gap 122' in the disclosure is not limited to this example. The gap 122' may have various shapes. For example, as illustrated in FIG. 2A, the metal layer 122 may have a plurality of rectangular gaps 122' having long sides parallel to the signal line 16. Alternatively, as illustrated in FIG. 2B, the metal layer 122 may have a plurality of rectangular gaps 122' having long sides parallel to the control line 15. Furthermore, as illustrated in FIG. 2C, the metal layer 122 may have polygonal gaps 122', rectangular gaps 122' and square gaps 122' arranged radially around the contact hole and/or the center of gravity of the metal layer 122. In the structures described with reference to FIGS. 1A and 2A to 2C, each covering member 121 may be shaped so as to fit the gap 122'. For the gaps 122' in FIG. 1A, a plurality of square covering members 121 may be arranged. For the gaps 122' in FIG. 2A, a plurality of rectangular covering members 121 having long sides parallel to the signal line 16 may be arranged. For the gaps 122' in FIG. 2B, a plurality of rectangular covering members 121 having long sides parallel to the control line 15 may be arranged. For the gaps 122' in FIG. 2C, polygonal covering members 121, rectangular covering members 121, and square covering members 121 may be arranged so as to fit the respective gaps 122'. Although the metal layer 122 is illustrated as a single layer in FIG. 1C, the disclosure is not limited to this illustration. The metal layer 122 may include a plurality of sublayers of different materials.

Figure 3:
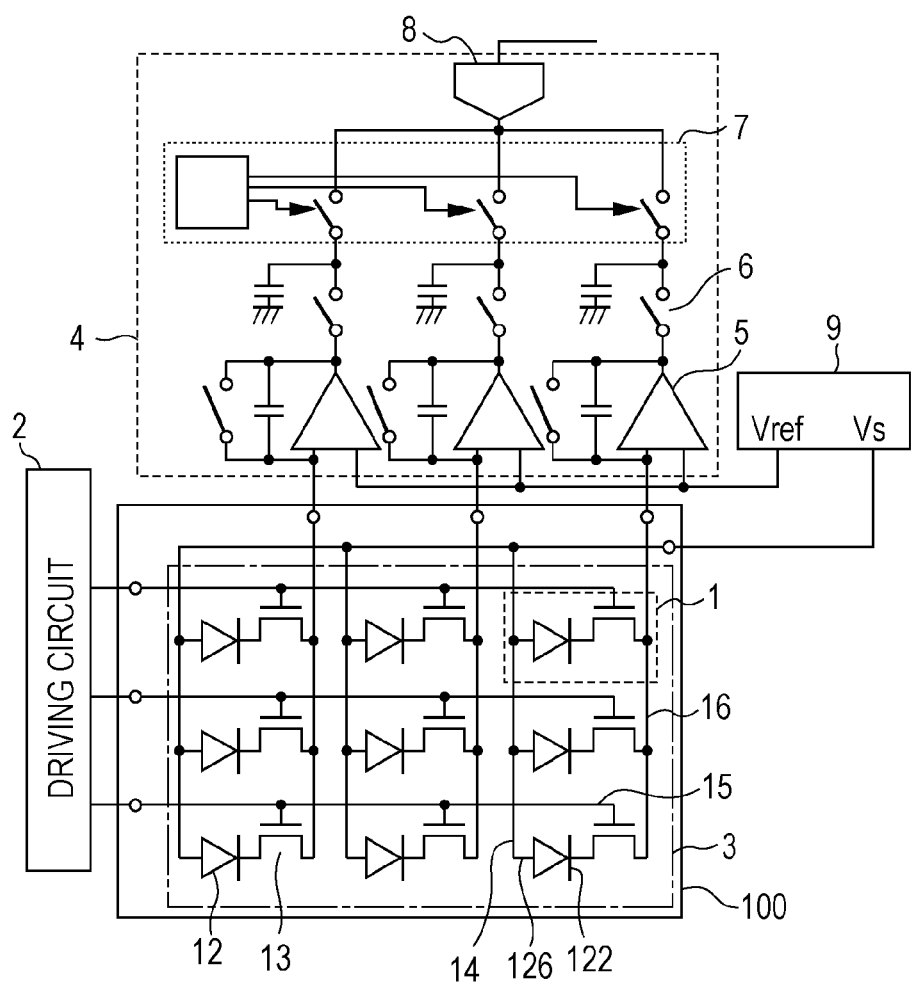
FIG. 3 is a schematic equivalent circuit diagram of the detecting apparatus.

A schematic equivalent circuit of the detecting apparatus according to the first embodiment will be described below with reference to FIG. 3. Although FIG. 3 illustrates the equivalent circuit of 3 rows by 3 columns for the convenience of description, the disclosure is not limited to this illustration. The detecting apparatus includes a pixel array of n rows by m columns (n and m are each a natural number greater than or equal to 2). The detecting apparatus according to this embodiment includes a converting unit 3 including an array of pixels 1 on the substrate 100. Each pixel 1 includes the converting element 12 to convert radiation or light into charge and the TFT 13 to output an electrical signal depending on the charge in the converting element 12. A scintillator (not illustrated)

for wavelength-converting radiation into visible light may be disposed on a surface adjacent to the counter electrodes 126 of the converting elements 12. Each electrode line 14 is connected to the counter electrodes 126 of the converting elements 12 arranged in a column direction. Each control line 15 is connected to the control electrodes 131 of the TFTs 13 arranged in a row direction and is electrically connected to a driving circuit 2. The driving circuit 2 supplies drive pulses to the control lines 15 arranged in the column direction sequentially or simultaneously, so that electrical signals from the pixels are output on a row-by-row basis to the signal lines 16 arranged in the row direction in a parallel manner. Each signal line 16 is connected to the first main electrodes 135 of the TFTs 13 arranged in the column direction and is electrically connected to a reading circuit 4. The reading circuit 4 includes, for each signal line 16, an integrating amplifier 5 to integrate and amplify the electrical signal from the signal line 16, and a sample-and-hold circuit 6 to sample and hold the resultant electrical signal output from the integrating amplifier 5. The reading circuit 4 further includes a multiplexer 7 to convert the parallel electrical signals output from the sample-and-hold circuits 6 into a series electrical signal and an analog-to-digital (A/D) converter 8 to convert the electrical signal into digital data. A power supply circuit 9 supplies a reference potential Vref to a noninverting input terminal of each integrating amplifier 5. The power supply circuit 9 is electrically connected to the electrode lines 14 arranged in the row direction, and supplies a bias potential Vs to the counter electrode 126 of each converting element 12.

An operation of the detecting apparatus according to this embodiment will be described below. The reference potential Vref is applied through each TFT 13 to the pixel electrode 122 of the corresponding converting element 12 and the bias potential Vs necessary for electron-hole pair separation caused by radiation or visible light is applied to the counter electrode 126 of the converting element 12. In such a state, radiation passed through an object or visible light depending on the radiation impinges on the converting element 12, the radiation or light is converted into charge, and the charge is accumulated in the converting element 12. The TFTs 13 are turned on on the row-by-row basis in response to drive pulses supplied from the driving circuit 2 through the control lines 15, so that the electrical signals depending on the charge are output on the row-by-row basis to the signal lines 16 in a parallel manner. The electrical signals output on the row-by-row basis are read as digital data of one row by the reading circuit 4. The above-described operation is sequentially performed on the row-by-row basis, so that the pixels 11 output image signals of one image to the reading circuit 4. Thus, the reading circuit 4 outputs image data, serving as digital data of one image. Although each pixel electrode includes the metal layer 122 having the gaps 122', the pixels 11 each have to output an image signal adequate to achieve the above-described operation. Accordingly, the pixel electrode may satisfy the following expression.

$$R_S \leq T/(n \times C_S) - R_{ON} \tag{1}$$

where $C_S$ denotes the capacitance of the converting element 12, $R_{ON}$ denotes the ON-state resistance of the TFT 13, T denotes the time required for the driving circuit 2 to sequentially drive the TFTs 13 of the pixels 11 on the row-by-row basis in order to output image signals that achieve a required S/N ratio, n denotes the number of rows of the arrays of pixels 11, and $R_S$ denotes the resistance of a component including the impurity semiconductor layer 123 and the pixel electrode.

The required S/N ratio is the difference between the amount of charge that may be produced in the converting element 12 and the amount of charge that may be transferred by turning on the TFT 13, namely, the reciprocal of the amount of charge remaining in the pixel 11 divided by the amount of charge that may be produced in the converting element 12. In the structure illustrated in FIG. 1C, the sheet resistance of the impurity semiconductor layer 123 may be less than or equal to 200 times the ON-state resistance $R_{ON}$ of the TFT 13.

Figure 4A:
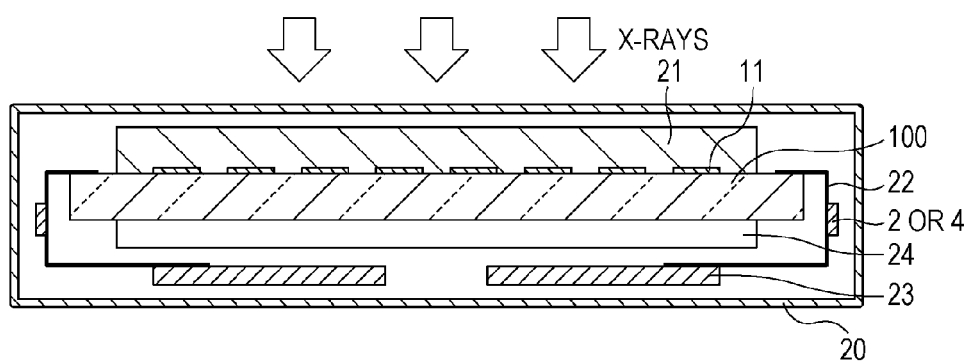
FIGS. 4A and 4B are schematic cross-sectional views for explaining a structure of the detecting apparatus.
Figure 4B:
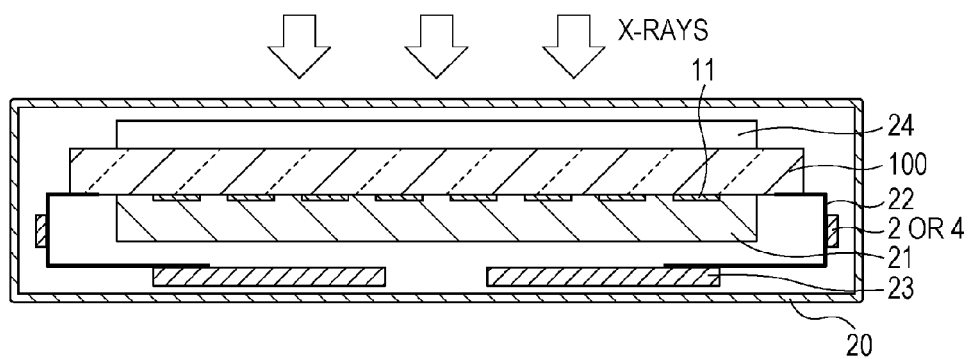

The structure of the detecting apparatus will now be described with reference to FIGS. 4A and 4B. FIG. 4A illustrates an exemplary structure of the detecting apparatus which includes the pixels 11 and a scintillator 21 arranged on a radiation entrance side of the substrate 100 in that order from the substrate 100 side. The detecting apparatus further includes a light source 24 and a circuit substrate 23 arranged on the opposite side of the substrate 100 from the side on which the pixel 11 are arranged in that order from the substrate 100 side. The light source 24 is used to emit visible light through the substrate 100 and the gaps 122' of the metal layer 122 to the semiconductor layer 124 of the converting element 12 of each pixel 11 in order to reduce an after image. The circuit substrate 23 includes the driving circuit 2 or the reading circuit 4 and is electrically connected to a flexible printed board 22 electrically connected to the pixels 11. The circuit substrate 23 further includes at least one of an integrated circuit to supply a control signal to the driving circuit 2 and an integrated circuit to process an image signal from the reading circuit 4. FIG. 4B illustrates another exemplary structure of the detecting apparatus which includes the pixels 11, the scintillator 21, and the circuit substrate 23 arranged on the opposite side of the substrate 100 from the radiation entrance side in that order from the substrate 100 side. The detecting apparatus includes the light source 24 on the radiation entrance side of the substrate 100 opposite from the side on which the pixels 11 are arranged. The detecting apparatus illustrated in each of FIGS. 4A and 4B includes a housing 20 that accommodates the substrate 100, the pixels 11, the scintillator 21, the flexible printed board 22, the circuit substrate 23, and the light source 24.

Second Embodiment

Figure 5A:
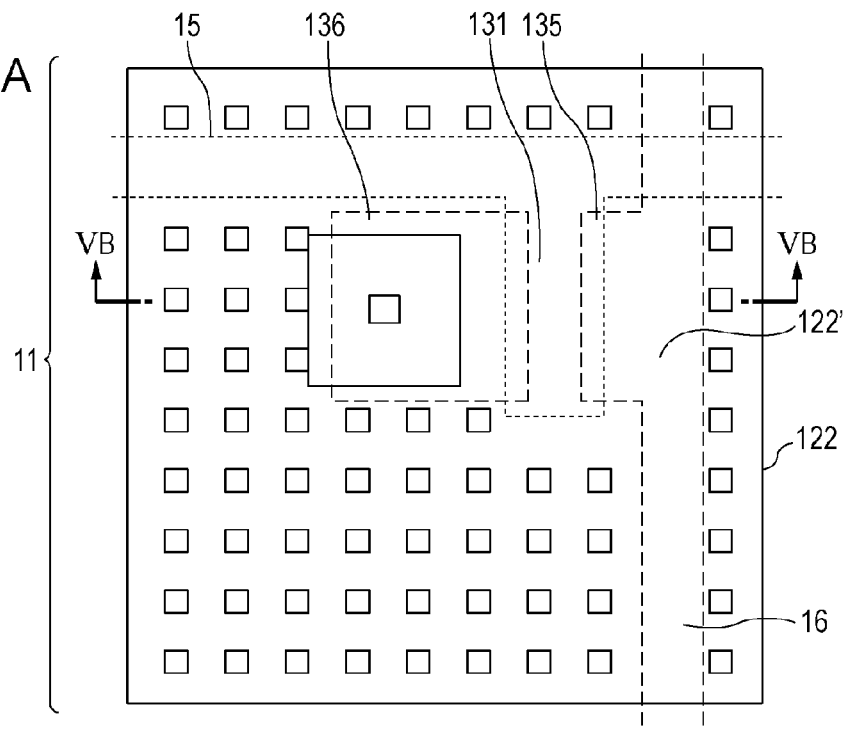
FIG. 5A is a schematic plan view of each pixel of a detecting apparatus according to a second embodiment.
Figure 5B:
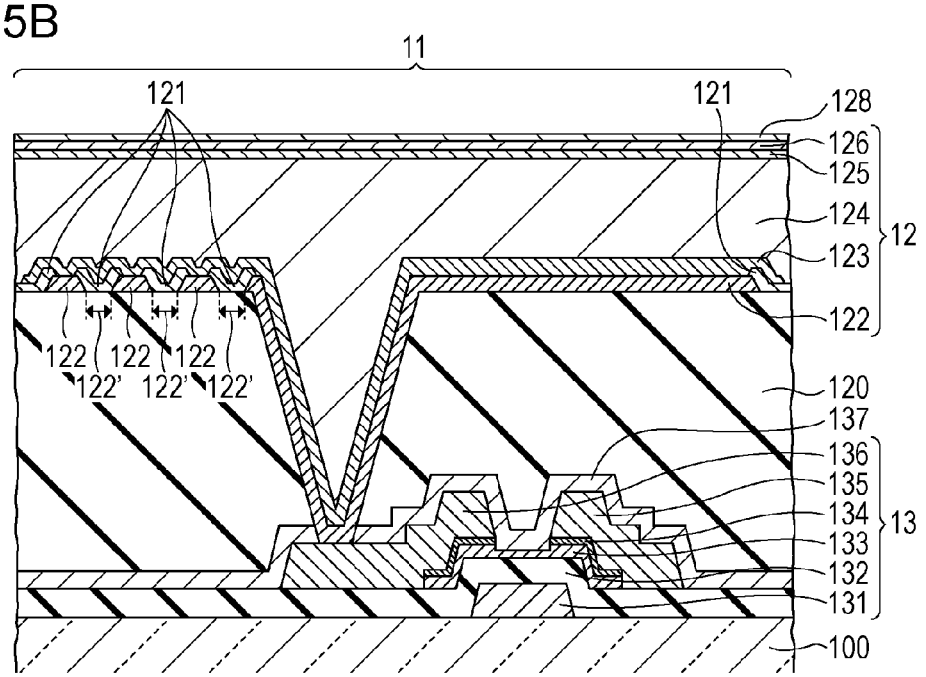
FIG. 5B is a schematic cross-sectional view of the pixel of the detecting apparatus according to the second embodiment.

A detecting apparatus according to a second embodiment will be described below with reference to FIGS. 5A and 5B. FIG. 5A is a schematic plan view of each pixel included in the detecting apparatus. FIG. 5B is a schematic cross-sectional view of the pixel taken along the line VB-VB of FIG. 5A. In FIG. 5A, the insulating layers, the covering members, the semiconductor layers, and the impurity semiconductor layers are omitted for simplicity. The second embodiment illustrated in FIGS. 5A and 5B differs from the first embodiment illustrated in FIGS. 1A and 1C in the following points.

The first point of difference is the position of each gap 122'. In the second embodiment, the metal layer 122 has the gaps 122' such that orthogonal projections of the gaps 122' are not superposed on at least one of the control line 15 and the signal line 16 in each pixel. The orthogonal projections of the gaps 122' are obtained by orthogonally projecting the gaps 122' on at least one of the control line 15 and the signal line 16. If the control line 15 is opposite the gaps 122', a variation in potential of the control line 15 caused by a drive pulse supplied to the control line 15 would affect the potential of the impurity semiconductor layer 123. If the signal line 16 is opposite the gaps 122', a variation in potential of the signal line 16 caused by an electrical signal output from another pixel 11 would affect the potential of the impurity semiconductor layer 123 of the converting element 12 of the pixel 11. Since the impurity semiconductor layer 123 has a higher resistivity than the metal layer 122, the time required for convergence of the potential variation in the impurity semiconductor layer 123 caused by the potential variation in the line is longer than that in the metal layer 122. Accordingly, the influence of the potential variation in the line may produce an artifact in an obtained image signal. To suppress the artifact, the metal layer 122 may be disposed in a region of the converting element 12 opposite the lines. Thus, the metal layer 122 has the gaps 122' such that the orthogonal projections of the gaps 122' are not superposed on at least one of the control line 15 and the signal line 16. Furthermore, the gaps 122' may be arranged in the metal layer 122 such that the orthogonal projections of the gaps 122' are not superposed on the TFT 13.

The second point of difference is that the semiconductor layer 124 and the impurity semiconductor layer 125 are not separated for each pixel 11 as illustrated in FIG. 5B. Accordingly, the area of arrangement of the semiconductor layer 124 and the impurity semiconductor layer 125 is larger than that in FIG. 1C, thus increasing the aperture ratio as compared with that in FIG. 1C. Although the counter electrode 126 may be separated for each pixel 11 in FIG. 5B, it is better not to separate the counter electrode 126 for each pixel 11 because it is advantageous in terms of increasing the aperture ratio. This second point of difference may be suitably applied to another embodiment.

Third Embodiment

Figure 6:
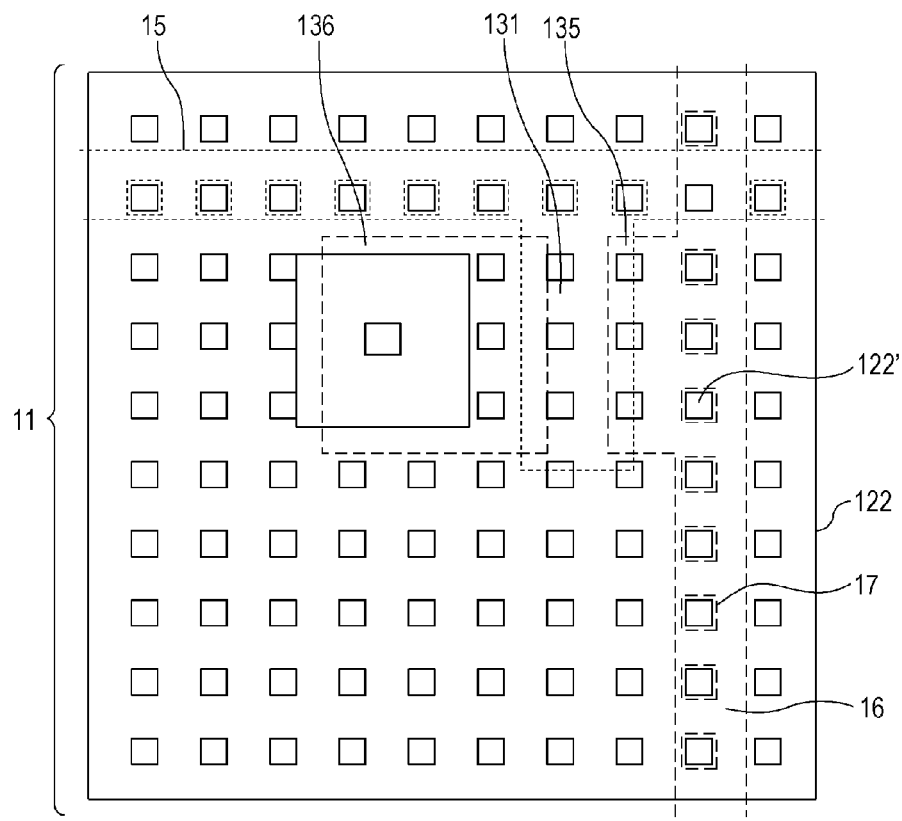
FIG. 6 is a schematic plan view of each pixel of a detecting apparatus according to a third embodiment.

A detecting apparatus according to a third embodiment will be described below with reference to FIG. 6. FIG. 6 is a schematic plan view of each pixel included in the detecting apparatus. In FIG. 6, the insulating layers, the covering members, the semiconductor layers, and the impurity semiconductor layers are omitted for simplicity. The third embodiment of FIG. 6 differs from the first embodiment illustrated in FIG. 1A in the following point.

In the third embodiment, the control line 15 and the signal line 16, each serving as a line electrically connected to the TFT 13, have gaps 17 arranged in positions including orthogonal projections of the gaps 122'. This arrangement is to suppress an artifact caused by variation in potential of the line as discussed above in the second embodiment. Eliminating the conductive layer for the line in the positions opposite the gaps 122', or allowing the line to have the gaps 17 in these positions suppresses a variation in potential of the impurity semiconductor layer 123, thus suppressing an artifact caused by variation in potential of the line.

Fourth Embodiment

Figure 7A:
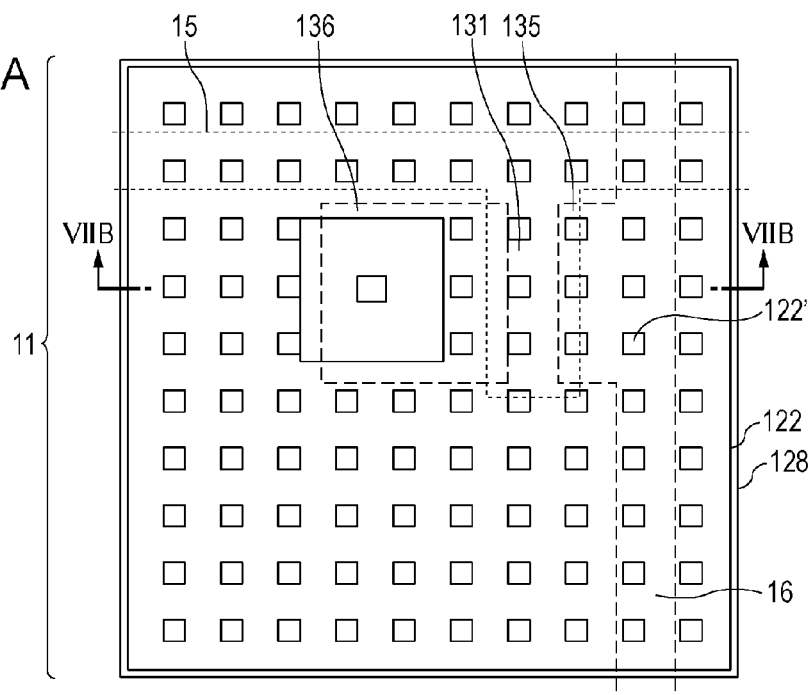
FIG. 7A is a schematic plan view of each pixel of a detecting apparatus according to a fourth embodiment.
Figure 7B:
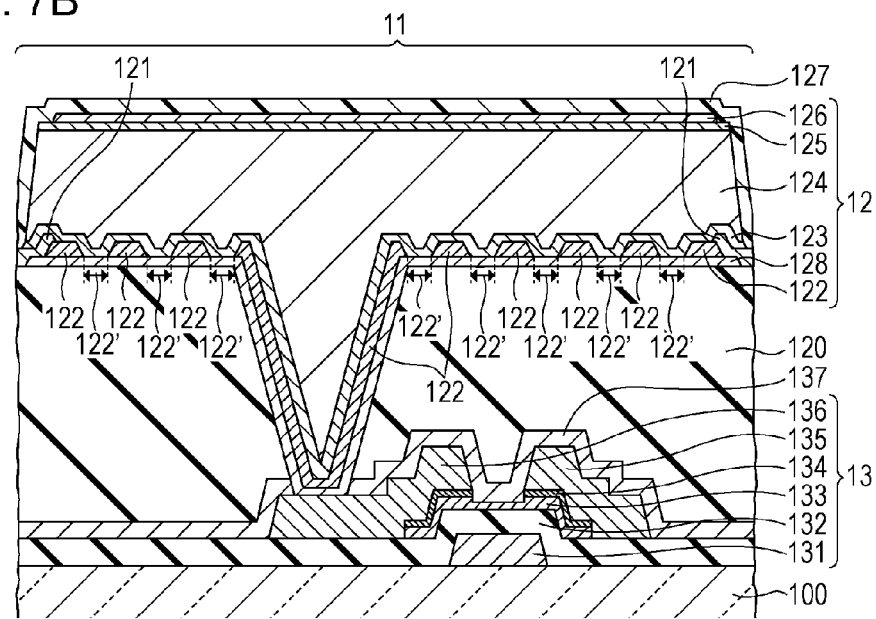
FIG. 7B is a schematic cross-sectional view of the pixel of the detecting apparatus according to the fourth embodiment.

A detecting apparatus according to a fourth embodiment will be described below with reference to FIGS. 7A and 7B. FIG. 7A is a schematic plan view of each pixel included in the detecting apparatus. FIG. 7B is a schematic cross-sectional view of the pixel taken along the line VIIB-VIIB of FIG. 7A. In FIG. 7A, the insulating layers, the covering members, the semiconductor layers, and the impurity semiconductor layers are omitted for simplicity. The fourth embodiment illustrated in FIGS. 7A and 7B differs from the first embodiment illustrated in FIGS. 1A and 1C in the following point.

In the fourth embodiment, a conductive layer 128 having a lower resistivity than the impurity semiconductor layer 123 is disposed between the metal layer 122 and the interlayer insulating layer 120 and the pixel electrode includes the metal layer 122 and the conductive layer 128. The conductive layer 128 has a higher light transmittance than the metal layer 122 and is in contact with the metal layer 122 and is in contact with the impurity semiconductor layer 123 in the gaps 122'. This arrangement is to suppress an artifact caused by variation in potential of the line as discussed above in the second embodiment. Since the conductive layer 128 is disposed between the impurity semiconductor layer 123 and the line in the gaps 122', the influence of the variation in potential of the line on the converting element 12 is lower than that in the arrangement in which the impurity semiconductor layer 123 is opposite the line. To sufficiently irradiate the semiconductor layer 124 with light from the light source 24, the conductive layer 128 has to have a higher light transmittance than the metal layer 122. The conductive layer 128, accordingly, may be formed of transparent conductive oxide. Although the transparent conductive oxide exhibits poor adhesion to the impurity semiconductor layer 123, this material is in contact with the impurity semiconductor layer 123 only in the gaps 122'. Thus, the metal layer 122 which exhibits good adhesion to the impurity semiconductor layer 123 can ensure sufficient adhesion for the pixel electrode. The above-described structure allows the pixel electrode to have a lower sheet resistance than the first embodiment. Thus, the area of the gaps 122' can be larger than that in the first embodiment. This enables the transmittance to light emitted from the light source 24 to be higher than that in the first embodiment. Consequently, an after image may be suppressed more than that in the first embodiment.

Fifth Embodiment

Figure 8A:
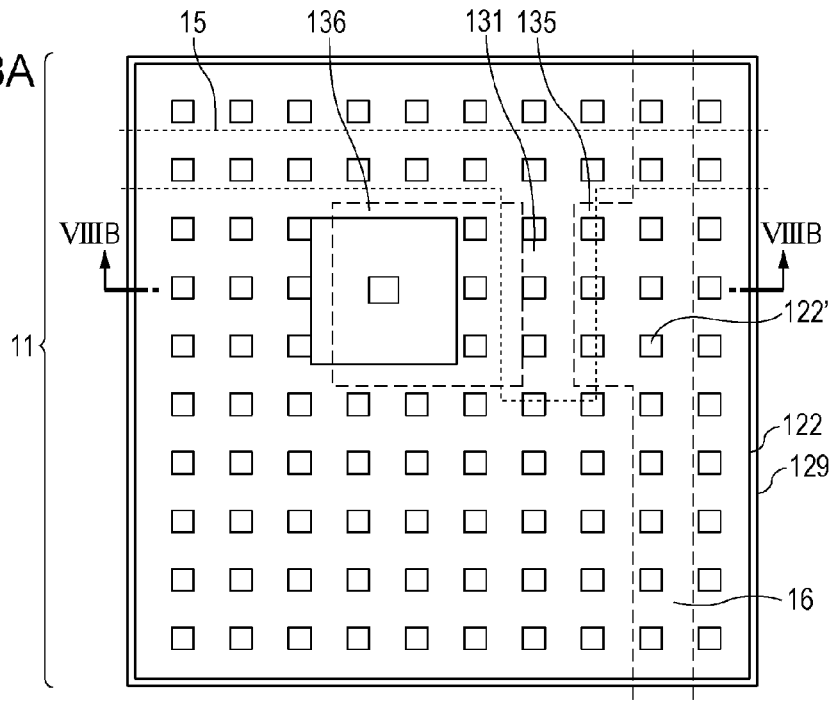
FIG. 8A is a schematic plan view of each pixel of a detecting apparatus according to a fifth embodiment.
Figure 8B:
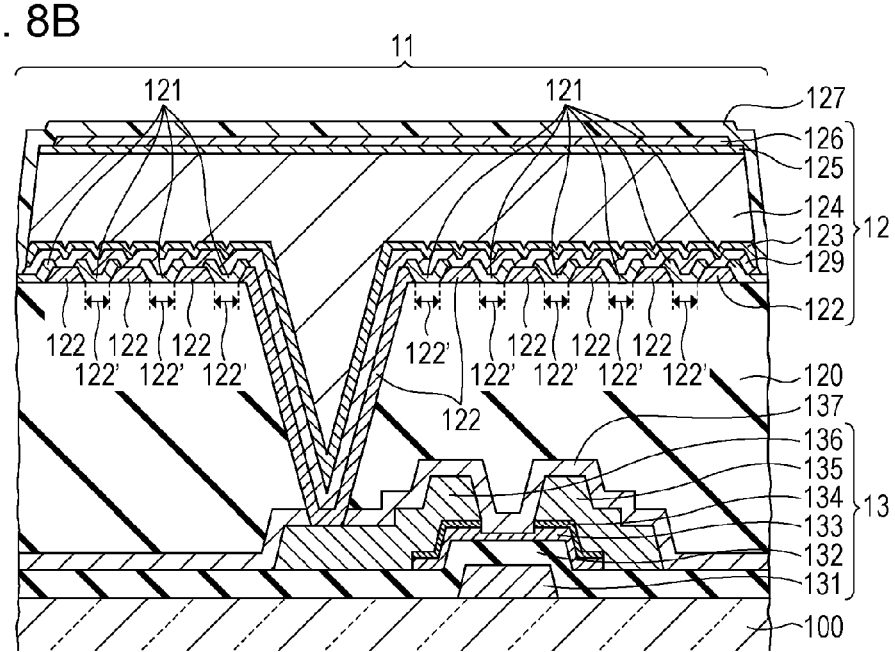
FIG. 8B is a schematic cross-sectional view of the pixel of the detecting apparatus according to the fifth embodiment.

A detecting apparatus according to a fifth embodiment will be described below with reference to FIGS. 8A and 8B. FIG. 8A is a schematic plan view of each pixel included in the detecting apparatus. FIG. 8B is a schematic cross-sectional view of the pixel taken along the line VIIIB-VIIIB of FIG. 8A. In FIG. 8A, the insulating layers, the covering members, the semiconductor layers, and the impurity semiconductor layers are omitted for simplicity. The fifth embodiment illustrated in FIGS. 8A and 8B differs from the fourth embodiment illustrated in FIGS. 7A and 7B in the following point.

In the fifth embodiment, a conductive layer 129 having a lower resistivity than the impurity semiconductor layer 123 is disposed between the metal layer 122 and the impurity semiconductor layer 123 and the pixel electrode includes the metal layer 122 and the conductive layer 129. The conductive layer 129 has a higher transmittance to visible light than the metal layer 122 and is in contact with the metal layer 122 and is in contact with the covering members 121 at least in the gaps 122'. In such a structure, the adhesion of the pixel electrode to the impurity semiconductor layer 123 depends on the adhesion of the conductive layer 129 to the impurity semiconductor layer 123. The conductive layer 129, accordingly, may be formed using a metal or alloy that exhibits a higher adhesion to an impurity semiconductor layer than transparent conductive oxide. The conductive layer 129 may have a higher transmittance to visible light than the metal layer 122, preferably, 10% or more. As a result of intensive study, the inventors have found that the conductive layer 129 can be allowed to have a transmittance necessary to suppress an after image by satisfying the following conditions. To suppress an after image, the converting element 12 has to be saturated by irradiation with light. An amount of saturation charge $N_1$ of the converting element 12 is expressed by the following expression.

$$N_1 = (\epsilon_0 * \epsilon_r * S * V)/(q * d) \qquad (2)$$

where S denotes the area (cm$^2$) of the semiconductor layer 124, d denotes the thickness of the semiconductor layer 124, $\epsilon_r$ denotes the relative permittivity (Fcm$^{-1}$) of the semiconductor layer 124, $\epsilon_0$ denotes the relative permittivity (Fcm$^{-1}$) of vacuum, V denotes the voltage (V) across the converting element 12, and q denotes the elementary charge (C).

A photo-carrier $N_2$ generated in the converting element 12 by irradiation with visible light from the light source 24 illustrated in FIG. 4A or 4B is expressed by the following expression.

$$N_2 = T_s {}^* T_a {}^* T_c {}^* T_i {}^* \eta {}^* P {}^* t {}^* S_o \tag{3}$$

where $T_s$ denotes the transmittance of the substrate 100 to visible light emitted from the light source 24, $T_a$ denotes the transmittance of the component between the converting element 12 and the substrate 100, $T_c$ denotes the transmittance of the conductive layer 129, $T_i$ denotes the transmittance of the impurity semiconductor layer 123, $\eta$ denotes the internal quantum efficiency of the semiconductor layer 124, P denotes the photon flux (photons·cm$^{-2}$·S$^{-1}$), t denotes the time (s) of irradiation with visible light, and $S_o$ denotes the area (cm$^2$) of the gaps 122'.

The saturation of the converting element 12 by light irradiation means $N_2 \geq N_1$. Accordingly, the transmittance $T_c$ of the conductive layer 129 may satisfy the following expression, derived from Expressions (2) and (3).

$$T_c(\epsilon_0 {}^* \epsilon_r {}^* S {}^* V)/(d {}^* q {}^* T_s {}^* T_a {}^* T_i {}^* \eta {}^* P {}^* t {}^* S_o) \tag{4}$$

The photon flux P is given by the following expression.

$$P = E {}^* \lambda/(Km {}^* F {}^* h {}^* c) \tag{5}$$

where $\lambda$ denotes the peak wavelength (nm) of visible light emitted from the light source 24, E denotes the illuminance (1×), Km denotes a maximum visual sensitivity (1 mW$^{-1}$), F denotes a relative visual sensitivity at the wavelength $\lambda$, h denotes the Planck's constant (Js), and c denotes the speed (ms$^{-1}$) of light.

The following expression is derived from Expressions (4) and (5).

$$T_c \geq (\epsilon_0 {}^* \epsilon_r {}^* S {}^* V {}^* Km {}^* F {}^* h {}^* c)/(d {}^* q {}^* T_s {}^* T_a {}^* T_i {}^{**} t {}^* S_o {}^* E {}^* \lambda) \tag{6}$$

Such a structure allows the adhesion of the pixel electrode to the impurity semiconductor layer 123 to be higher than those in the first to fourth embodiments. Furthermore, since the sheet resistance of the pixel electrode can be lower than that in the first embodiment, the area of the gaps 122' can be larger than that in the first embodiment. Thus, the transmittance to light emitted from the light source can be higher than that in the first embodiment, so that an after image can be suppressed more than that in the first embodiment. The conductive layer 129 may be formed of Mo, an alloy containing Mo, Al, or an alloy containing Al that has light transmissivity in form of a thin layer and can be processed by dry etching.

Sixth Embodiment

Figure 9A:
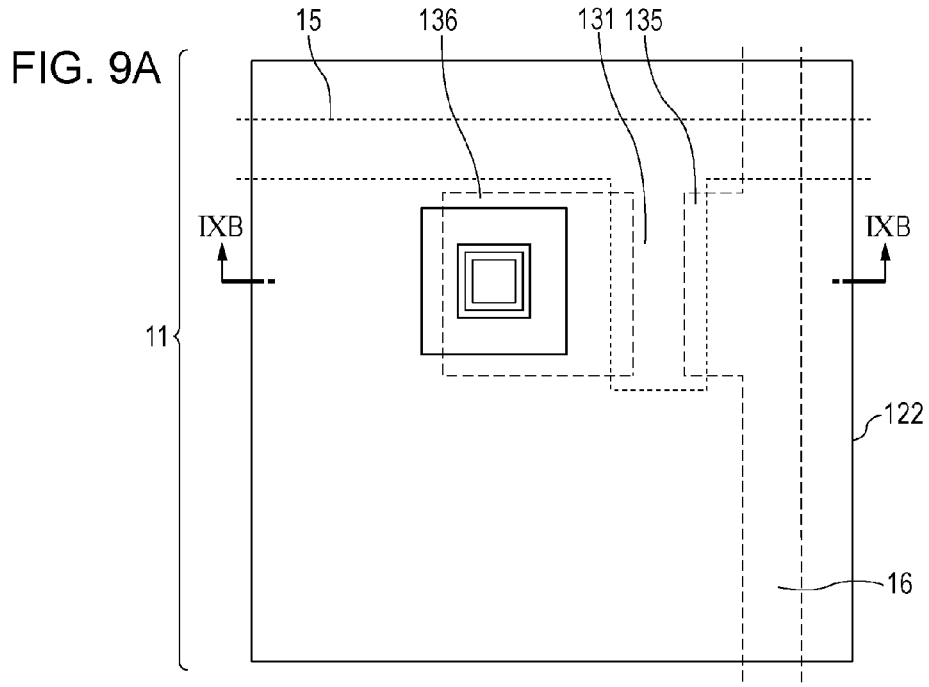
FIG. 9A is a schematic plan view of each pixel of a detecting apparatus according to a sixth embodiment.
Figure 9B:
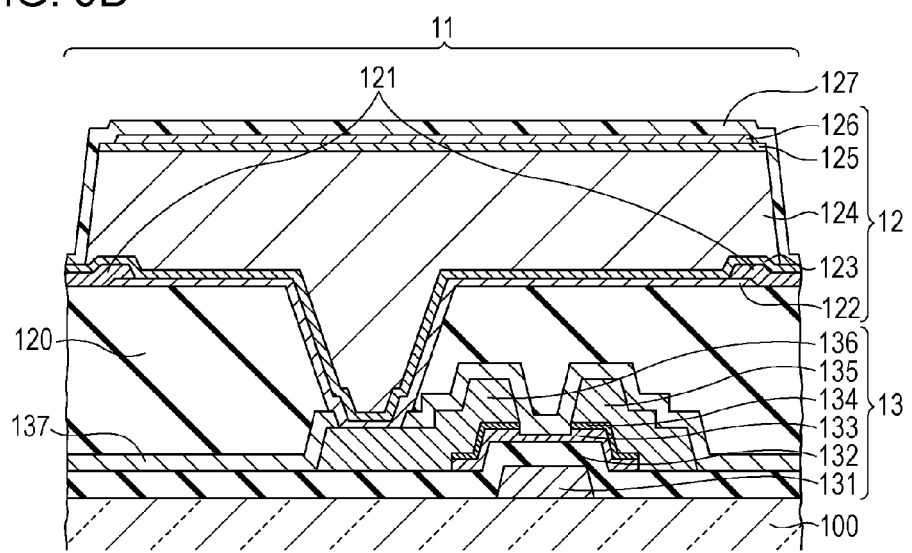
FIG. 9B is a schematic cross-sectional view of the pixel of the detecting apparatus according to the sixth embodiment.

A detecting apparatus according to a sixth embodiment will be described below with reference to FIGS. 9A and 9B. FIG. 9A is a schematic plan view of each pixel included in the detecting apparatus. FIG. 9B is a schematic cross-sectional view of the pixel taken along the line IXB-IXB of FIG. 9A. In FIG. 9A, the insulating layers, the covering members, the semiconductor layers, and the impurity semiconductor layers are omitted for simplicity. The sixth embodiment illustrated in FIGS. 9A and 9B differs from the fourth embodiment illustrated in FIGS. 7A and 7B in the following point.

To suppress an after image, at least part of the metal layer 122 in the sixth embodiment has a thickness that permits visible light emitted from a light source (not illustrated) which may be disposed on the surface of the substrate 100 opposite the surface on which the pixels 11 are arranged to pass through the metal layer 122. Since at least part of the metal layer 122 has a thickness that permits visible light to pass through the layer, the semiconductor layer 124 can be sufficiently irradiated with light from the light source (not illustrated). Furthermore, the metal or alloy has a lower resistivity than transparent conductive oxide (having a resistivity up to 2.0×10$^{-4}$ Ωcm). Thus, the resistance of the metal layer 122 can be easily suppressed to a sufficiently low level so that the metal layer 122 having a thickness that permits visible light to pass through the layer can be used as a pixel electrode. Consequently, a sufficient pixel transfer rate can be easily ensured. As described above, the use of the metal layer 122 at least partly having a thickness that permits visible light to pass through the layer can provide a detecting apparatus capable of exhibiting good adhesion between an impurity semiconductor layer and a pixel electrode, allowing a converting element to have good dark current characteristics, and ensuring a good transfer rate.

The transmittance of the pixel electrode to visible light may be greater than or equal to 10%. As a result of intensive study, the inventors have found that the pixel electrode can be allowed to have a transmittance necessary to suppress an after image by satisfying the following condition. To suppress an after image, the converting element 12 has to be saturated by light irradiation. The thickness of the metal layer 122 may be appropriately set so that the transmittance $T_c$ of the pixel electrode satisfies Expression (6). Although FIG. 9B illustrates the metal layer 122 as a single layer, the disclosure is not limited to this illustration. The metal layer 122 may include a plurality of sublayers of different materials. In the structure in which the pixel electrode of each pixel 11 includes the metal layer 122 at least partly having a thickness that permits visible light to pass through the layer, so long as the pixel electrode satisfies Expression (1), sufficient image signals may be output from the pixels 11.

Figure 10:
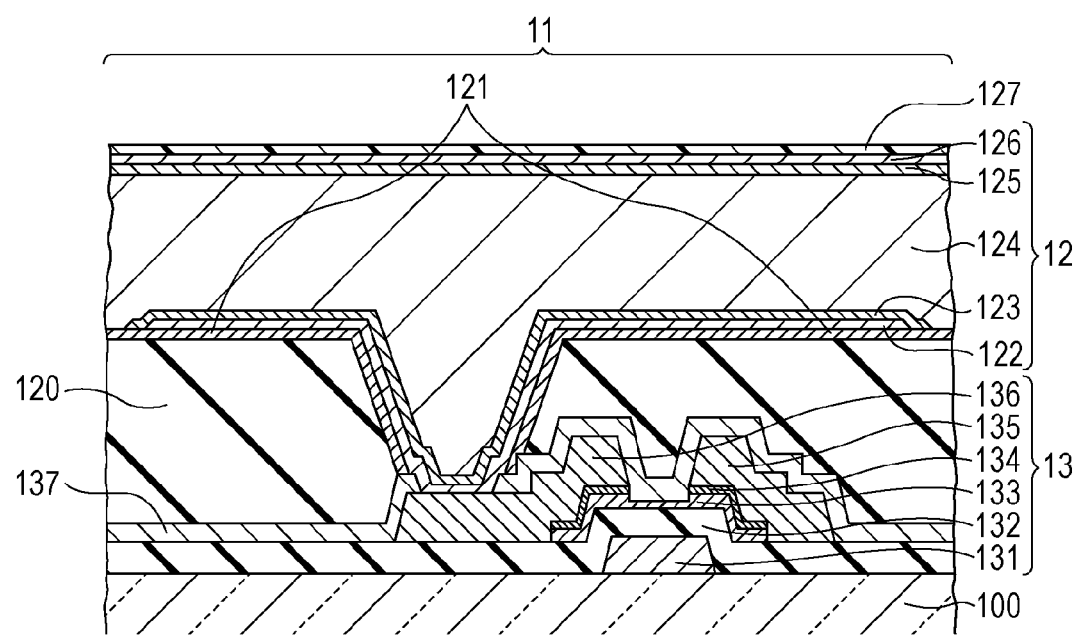
FIG. 10 is a schematic plan view of each pixel of a detecting apparatus according to a modification of the sixth embodiment.

Although FIG. 9B illustrates the structure in which the semiconductor layer 124 and the impurity semiconductor layer 125 are separated for each pixel 11, the disclosure is not limited to this illustration. As illustrated in FIG. 10, it is unnecessary to separate the semiconductor layer 124 and the impurity semiconductor layer 125 for each pixel 11. In the structure illustrated in FIG. 10, the area of arrangement of the semiconductor layer 124 and the impurity semiconductor layer 125 is larger than that in FIG. 9B, thus increasing the aperture ratio as compared with that in FIG. 9B. Although the counter electrode 126 may be separated for each pixel 11 in FIG. 10, it is better not to separate the counter electrode 126 for each pixel 11 because it is advantageous in terms of increasing the aperture ratio. This feature may be suitably applied to another embodiment. Although FIG. 9B illustrates the structure in which each covering member 121 is disposed between the adjacent metal layers 122, the disclosure is not limited to this illustration. As illustrated in FIG. 10, the covering member 121 may be disposed so as to overlie the entire surface of the interlayer insulating layer 120, such that the metal layer 122 and the covering member 121 overlie the interlayer insulating layer 120. In this case, metal used as a material for the metal layer 122 may be selected from Al, Mo (5.0×10$^{-8}$ Ωcm), Cr, Ti, W (5.65×10$^{-6}$ Ωcm), and Cu. For alloy used as a material, an Al alloy, such as Al—Nd, may be used.

Seventh Embodiment

Figure 11A:
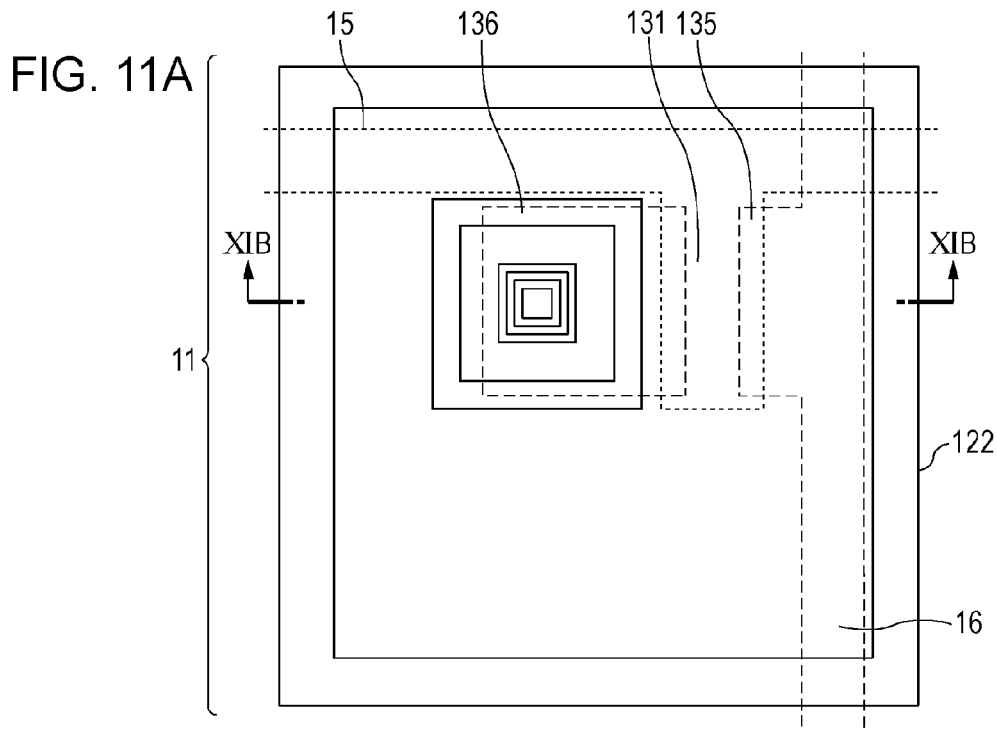
FIG. 11A is a schematic plan view of each pixel of a detecting apparatus according to a seventh embodiment.
Figure 11B:
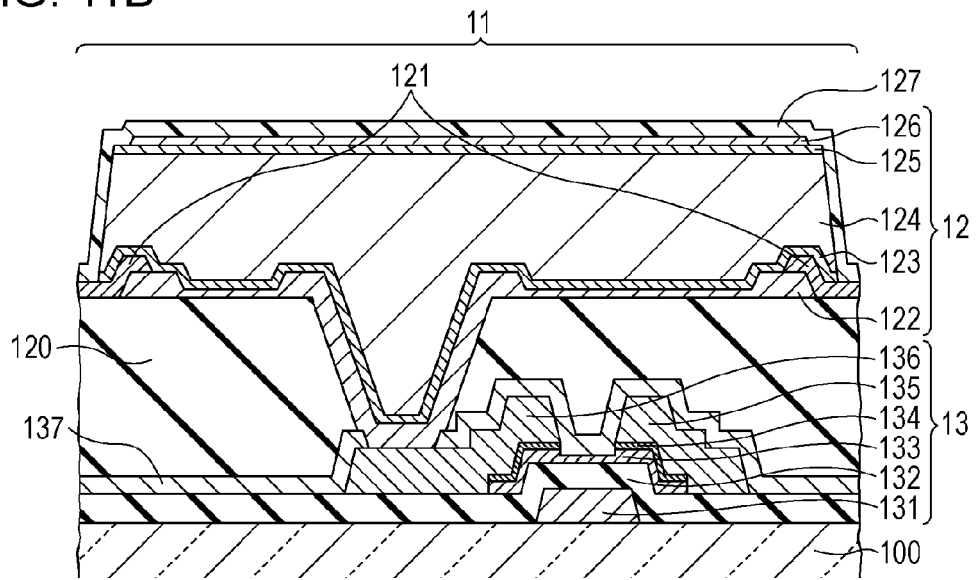
FIG. 11B is a schematic cross-sectional view of the pixel of the detecting apparatus according to the seventh embodiment.

A detecting apparatus according to a seventh embodiment will be described below with reference to FIGS. 11A and 11B. FIG. 11A is a schematic plan view of each pixel included in the detecting apparatus. FIG. 11B is a schematic cross-sectional view of the pixel taken along the line XIB-XIB of FIG. 11A. In FIG. 11A, the insulating layers, the covering members, the semiconductor layers, and the impurity semiconductor layers are omitted for simplicity. The seventh embodiment illustrated in FIGS. 11A and 11B differs from the sixth embodiment illustrated in FIGS. 9A and 9B in the following point.

Although the entire metal layer 122 has a thickness that permits visible light from the light source 24 to pass through the layer in the sixth embodiment, the metal layer 122 partly has a thickness that permits visible light from the light source 24 to pass through the layer in the seventh embodiment. Specifically, the metal layer 122 other than a portion in the contact hole and an outer end portion has a thickness that permits visible light from the light source 24 to pass through the layer. Thus, the reliability of electrical connection between the pixel electrode and the second main electrode 136 in the contact hole and the mechanical strength of the pixel electrode can be increased as compared with those in the sixth embodiment illustrated in FIG. 9B. Although FIG. 11B illustrates the metal layer 122 as a single layer, the disclosure is not limited to this illustration. For example, the metal layer 122 may be a laminate including a first sublayer and a second sublayer, the first sublayer may be formed of Al—Nd alloy and have a thickness of 30 nm, the second sublayer may be formed of Mo and have a thickness of 100 nm, and the second sublayer may be removed in the portions where visible light from the light source 24 is permitted to pass through the metal layer 122.

Eighth Embodiment

Figure 12A:
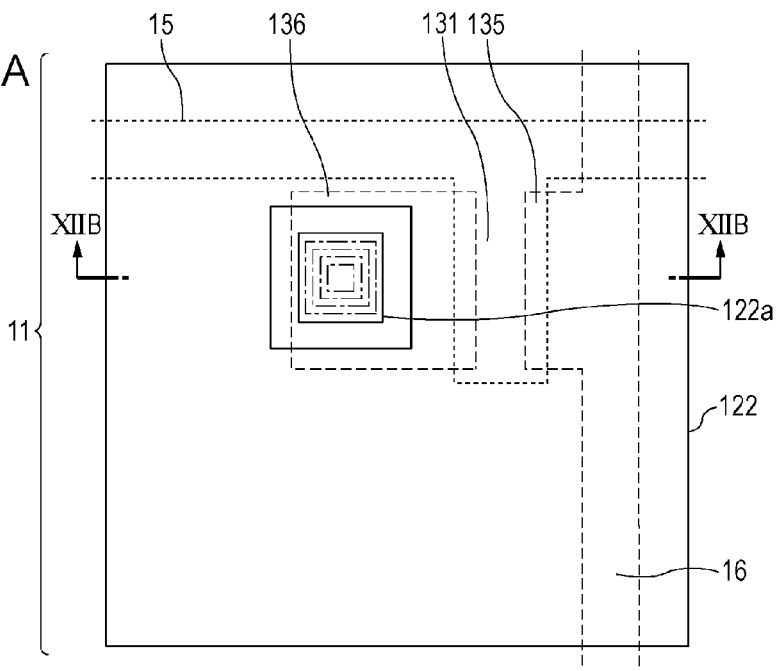
FIG. 12A is a schematic plan view of each pixel of a detecting apparatus according to an eighth embodiment.
Figure 12B:
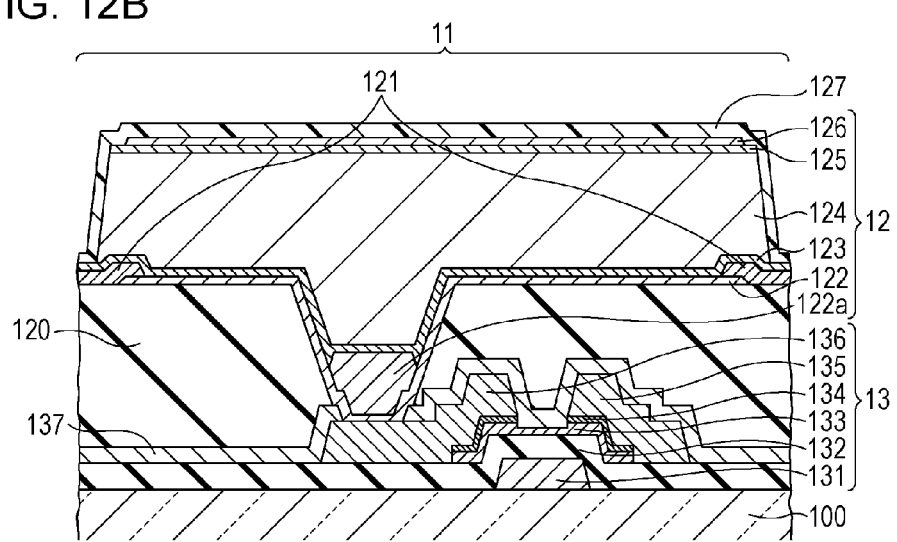
FIG. 12B is a schematic cross-sectional view of the pixel of the detecting apparatus according to the eighth embodiment.

A detecting apparatus according to an eighth embodiment will be described below with reference to FIGS. 12A and 12B. FIG. 12A is a schematic plan view of each pixel included in the detecting apparatus. FIG. 12B is a schematic cross-sectional view of the pixel taken along the line XIIB-XIIB of FIG. 12A. In FIG. 12A, the insulating layers, the covering members, the semiconductor layers, and the impurity semiconductor layers are omitted for simplicity. The eighth embodiment illustrated in FIGS. 12A and 12B differs from the sixth embodiment illustrated in FIGS. 9A and 9B in the following point.

The eighth embodiment differs from the sixth embodiment in that the pixel electrode further includes a conductive member 122a that overlies a step of the metal layer 122 in the vicinity of a portion of the metal layer 122 electrically connected to the TFT 13. In the contact hole, the metal layer 122 has the step in the vicinity of the portion electrically connected to the second main electrode 136 of the TFT 13. If the metal layer 122 is thin, the layer may be torn at the step. According to this embodiment, the pixel electrode further includes the conductive member 122a overlying the step, thus preventing a connection failure caused by a tear in the metal layer 122 at the step. Consequently, the reliability of electrical connection between the pixel electrode and the second main electrode 136 in the contact hole and the mechanical strength of the pixel electrode can be increased more than that in the sixth embodiment illustrated in FIG. 9B. Metal used as a material for the conductive member 122a may be selected from Al, Mo ($5.0 \times 10^{-8}$ Ωcm), Cr, Ti, W, and Cu. Alloy used as a material for the conductive member 122a may be an Al alloy, such as Al—Nd.

Ninth Embodiment

Figure 13A:
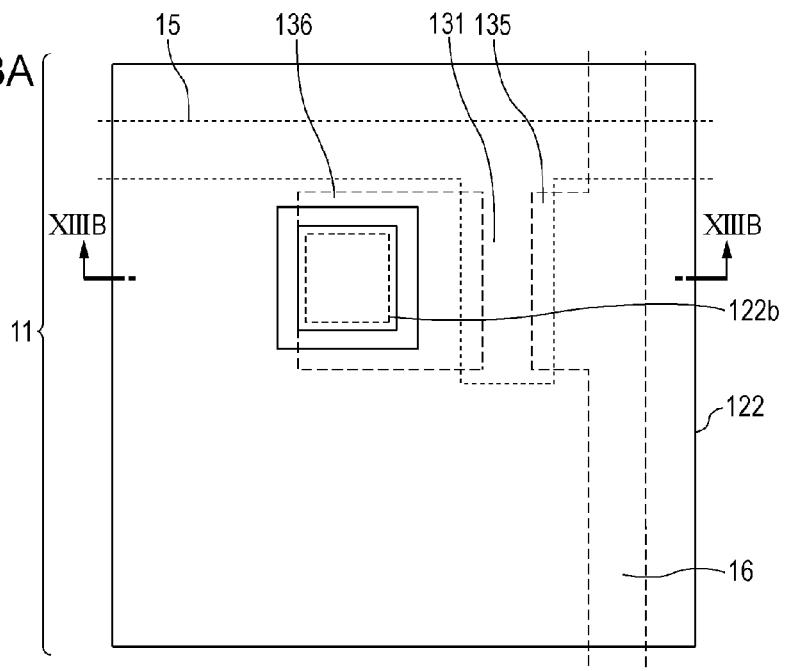
FIG. 13A is a schematic plan view of each pixel of a detecting apparatus according to a ninth embodiment.
Figure 13B:
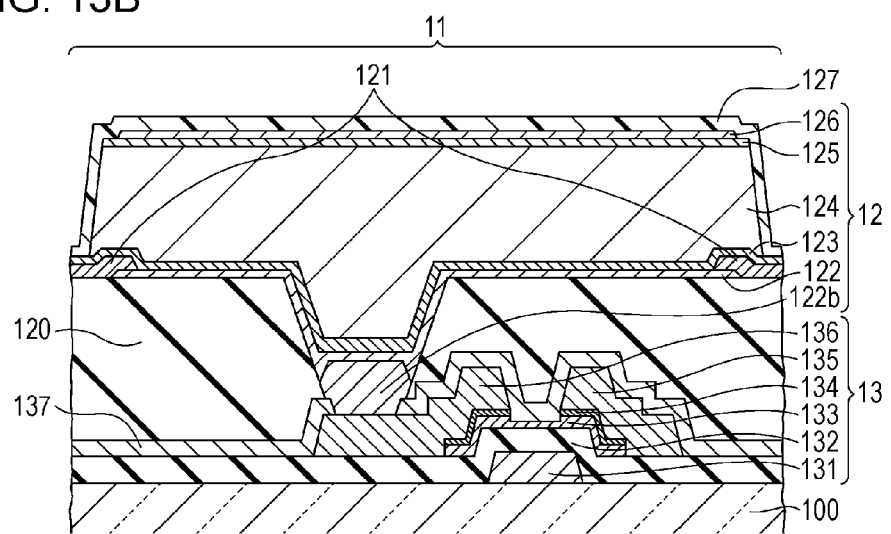
FIG. 13B is a schematic cross-sectional view of the pixel of the detecting apparatus according to the ninth embodiment.

A detecting apparatus according to a ninth embodiment will be described below with reference to FIGS. 13A and 13B. FIG. 13A is a schematic plan view of each pixel included in the detecting apparatus. FIG. 13B is a schematic cross-sectional view of the pixel taken along the line XIIIB-XIIIB of FIG. 13A. In FIG. 13A, the insulating layers, the covering members, the semiconductor layers, and the impurity semiconductor layers are omitted for simplicity. The ninth embodiment illustrated in FIGS. 13A and 13B differs from the sixth embodiment illustrated in FIGS. 9A and 9B in the following point.

The ninth embodiment differs from the sixth embodiment in that the pixel electrode further includes a conductive member 122b that overlies a portion of the TFT 13 electrically connected to the pixel electrode. The protection layer 137 has an end in the vicinity of a portion of the pixel electrode electrically connected to the second main electrode 136 of the TFT 13. If the metal layer 122 is thin, a step may be formed in part of the metal layer 122 overlying the end of the protection layer 137 and the metal layer 122 may be torn at the step. According to this embodiment, the pixel electrode further includes the conductive member 122b overlying the second main electrode 136 of the TFT 13 and the end of the protection layer 137, thus preventing a connection failure caused by a tear in the metal layer 122. Consequently, the reliability of electrical connection between the pixel electrode and the second main electrode 136 in the contact hole and the mechanical strength of the pixel electrode can be increased more than that in the sixth embodiment illustrated in FIG. 9B. Metal used as a material for the conductive member 122b may be selected from Al, Mo ($5.0 \times 10^{-8}$ Ωcm), Cr, Ti, W, and Cu. Alloy used as a material for the conductive member 122b may be an Al alloy, such as Al—Nd.

Tenth Embodiment

Figure 14A:
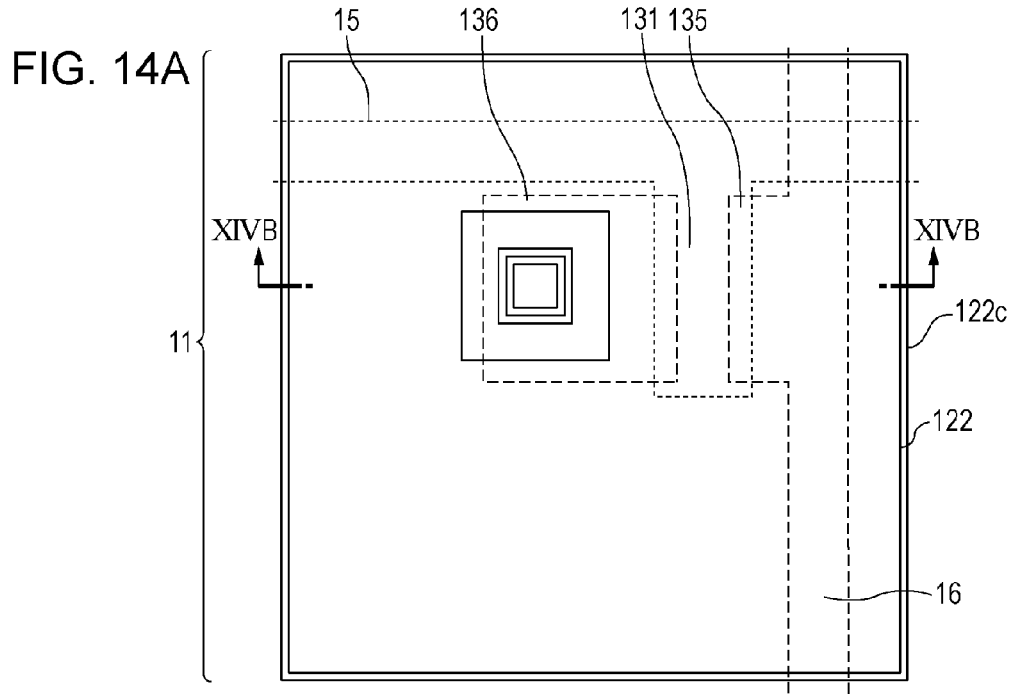
FIG. 14A is a schematic plan view of each pixel of a detecting apparatus according to a tenth embodiment.
Figure 14B:
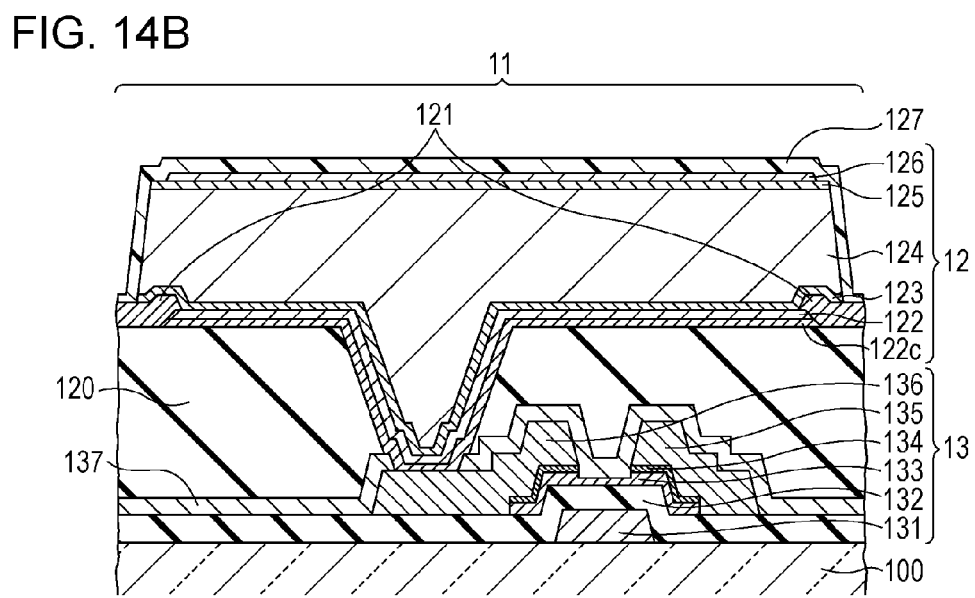
FIG. 14B is a schematic cross-sectional view of the pixel of the detecting apparatus according to the tenth embodiment.

A detecting apparatus according to a tenth embodiment will be described with reference to FIGS. 14A and 14B. FIG. 14A is a schematic plan view of each pixel included in the detecting apparatus. FIG. 14B is a schematic cross-sectional view of the pixel taken along the line XIVB-XIVB of FIG. 14A. In FIG. 14A, the insulating layers, the covering members, the semiconductor layers, and the impurity semiconductor layers are omitted for simplicity. The tenth embodiment illustrated in FIGS. 14A and 14B differs from the sixth embodiment illustrated in FIGS. 9A and 9B in the following point.

The tenth embodiment differs from the sixth embodiment in that the pixel electrode further includes a conductive layer 122c that is disposed between the metal layer 122 and the interlayer insulating layer 120 and is electrically connected to the metal layer 122 and is formed of transparent conductive oxide. Although the transparent conductive oxide exhibits poor adhesion to the impurity semiconductor layer 123, the metal layer 122 is disposed between the conductive layer 122c and the impurity semiconductor layer 123 and the conductive layer 122c is accordingly not in contact with the impurity semiconductor layer 123. Thus, the metal layer 122 exhibiting good adhesion to the impurity semiconductor layer 123 can provide sufficient adhesion for the pixel electrode. In addition, such a structure allows the sheet resistance of the pixel electrode to be lower than that in the sixth embodiment as well as ensuring a sufficient transmittance to visible light from the light source 24.

Application

Figure 15:
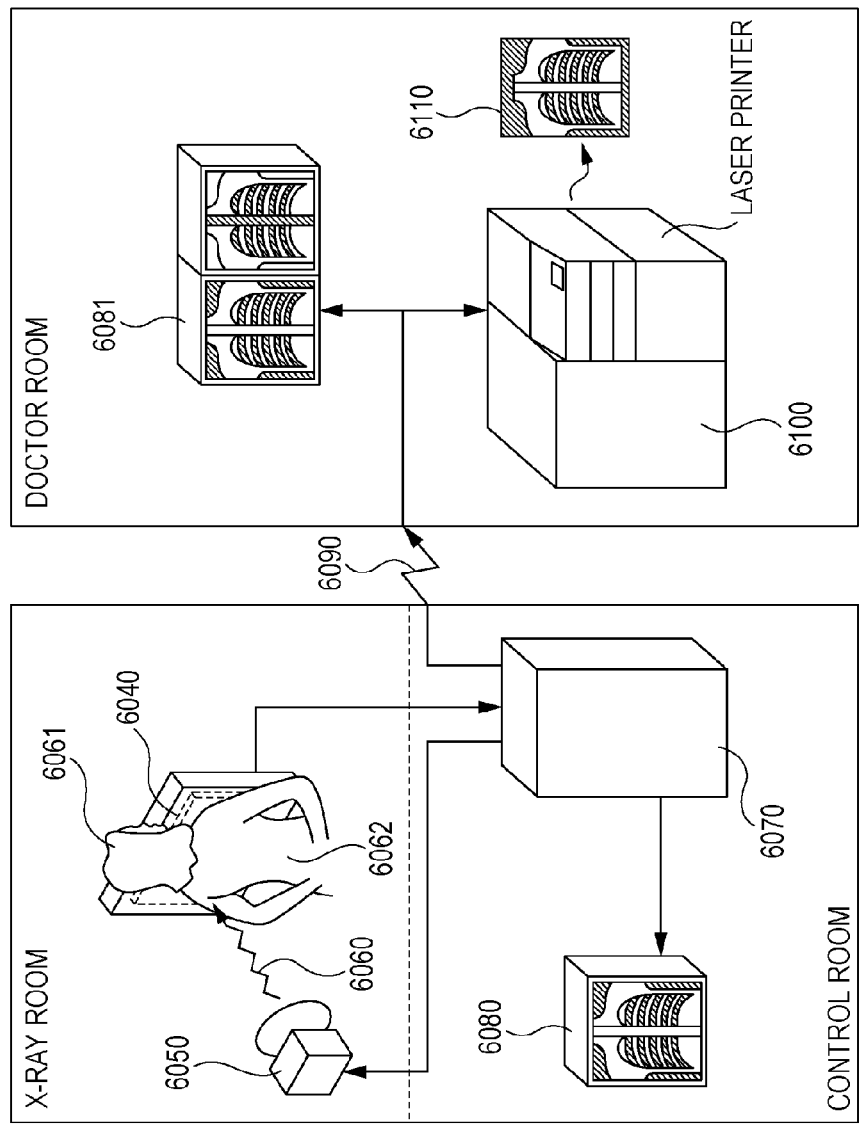
FIG. 15 is a schematic diagram of a radiation detecting system including the detecting apparatus according to one embodiment.

A radiation detecting system including the detecting apparatus according to an embodiment will be described with reference to FIG. 15.

X-rays 6060 emitted from an X-ray tube 6050, serving as a radiation source, pass through a chest 6062 of a patient or object 6061 and impinge on converting elements included in a detecting apparatus 6040 according to an embodiment. The impinging X-rays contain information about the inside of the body of the patient 6061. Each converting unit 3 converts radiation into charge depending on the X-rays to obtain electrical information. This information is converted into digital data and the data is processed to construct an image by an image processor 6070, serving as a signal processing unit. The image can be observed on a display 6080, serving as a display unit, in a control room.

Furthermore, the information can be transmitted to a remote place through a transmission unit, such as a telephone line 6090, so that the information can be displayed on a display 6081, serving as a display unit, in a doctor room as another place or can be stored in a storage unit, such as an optical disk, and a doctor in the remote place can make a diagnosis based on the information. In addition, the information can be recorded on a film 6110, serving as a recording medium, by a film processor 6100, serving as a recording unit.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2013-103325 filed May 15, 2013 and No. 2013-103327 filed May 15, 2013, which are hereby incorporated by reference herein in their entirety.

What is claimed is:

1. A detecting apparatus comprising:
   a substrate that permits visible light to pass therethrough;
   a converting element including a pixel electrode, an impurity semiconductor layer, and a semiconductor layer arranged in that order from a side adjacent to the substrate, the converting element being configured to convert radiation or light into charge; and
   a light source configured to emit the visible light through the substrate to the converting element,
   wherein the pixel electrode includes a metal layer that permits the visible light to pass therethrough.

2. The apparatus according to claim 1, wherein the metal layer has a gap in a region superposed on an orthogonal projection of the semiconductor layer.

3. The apparatus according to claim 2, further comprising:
   a transistor disposed between the substrate and the pixel electrode; and
   a line electrically connected to the transistor,
   wherein the line has a gap at a position including an orthogonal projection of the gap.

4. The apparatus according to claim 2, further comprising:
   a transistor disposed between the substrate and the pixel electrode; and
   a line electrically connected to the transistor,
   wherein the metal layer has the gap such that an orthogonal projection of the gap is not superposed on the line.

5. The apparatus according to claim 2,
   wherein the pixel electrode further includes a conductive layer disposed between the metal layer and the impurity semiconductor layer, and
   wherein the conductive layer comprises metal or alloy, the conductive layer has a higher light transmittance than the metal layer, and the conductive layer is in contact with the metal layer and is in contact with the impurity semiconductor layer in the gap.

6. The apparatus according to claim 2, further comprising:
   an interlayer insulating layer disposed between the substrate and the pixel electrode,
   wherein the pixel electrode further includes a conductive layer disposed between the metal layer and the interlayer insulating layer, and
   wherein the conductive layer has a higher light transmittance than the metal layer and the conductive layer is in contact with the metal layer and is in contact with the impurity semiconductor layer in the gap.

7. The apparatus according to claim 6, wherein the conductive layer comprises transparent conductive oxide.

8. The apparatus according to claim 2, further comprising:
   a transistor disposed between the substrate and the pixel electrode; and
   an interlayer insulating layer disposed between the pixel electrode and each of the substrate and the transistor,
   wherein the interlayer insulating layer has a contact hole through which the pixel electrode is electrically connected to the transistor, and
   wherein the metal layer has the gap in the region other than a region in the contact hole.

9. The apparatus according to claim 1, wherein at least part of the metal layer has a thickness that permits the visible light to pass through the metal layer.

10. The apparatus according to claim 9, wherein the metal layer has a thickness that allows the pixel electrode to have a transmittance $T_c$ to the visible light so as to satisfy $$T_c \geq (\epsilon_0 * \epsilon_r * V * Km * F * h * c)/(d * q * T_s * T_a * T_i * * t * E * \lambda),$$

where d denotes a thickness of the semiconductor layer, $\epsilon_r$ denotes a relative permittivity of the semiconductor layer, $\epsilon_0$ denotes a relative permittivity of vacuum, V denotes a voltage across the converting element, q denotes elementary charge, $T_s$, denotes a transmittance of the substrate to the visible light, $T_a$ denotes a transmittance of a component between the converting element and the substrate to the visible light, $T_i$ denotes a transmittance of the impurity semiconductor layer to the visible light, η denotes internal quantum efficiency of the semiconductor layer, t denotes time of irradiation with the visible light, E denotes an illuminance of the visible light, Km denotes a maximum visual sensitivity of the visible light, h denotes a Planck's constant, c denotes a speed of light, λ denotes a peak wavelength of the visible light, and F denotes a relative visual sensitivity at the wavelength λ.

11. The apparatus according to claim 9, further comprising:
   a transistor disposed between the substrate and the pixel electrode; and
   an interlayer insulating layer disposed between the pixel electrode and each of the substrate and the transistor,
   wherein the interlayer insulating layer has a contact hole through which the pixel electrode is electrically connected to the transistor,
   wherein the transistor is electrically connected to the metal layer in the contact hole, and
   wherein the pixel electrode further includes a conductive member that overlies a step of the metal layer disposed around a portion of the metal layer electrically connected to the transistor.

12. The apparatus according to claim 11, wherein the pixel electrode further includes a conductive member that overlies a portion of the transistor electrically connected to the pixel electrode.

13. The apparatus according to claim 1, further comprising:
   a plurality of pixels each including the converting element and a transistor electrically connected to the pixel electrode, the transistor being configured to transfer the charge, the pixels being arranged in an array on the substrate; and a driving circuit configured to sequentially drive the transistors of the pixels on a row-by-row basis in order to output image signals based on the charge from the pixels, wherein the pixel electrodes satisfies $$R_S \leq T/(n \times C_S) - R_{ON},$$

where $C_S$ denotes a capacitance of the converting element, $R_{ON}$ denotes an ON-state resistance of the transistor, T denotes time required for the driving circuit to sequentially drive the transistors of the pixels on the row-by-row basis in order to output the image signals that achieve a required S/N ratio, n denotes a number of rows of the pixel array, and $R_S$ denotes a resistance of a component including the impurity semiconductor layer and the pixel electrode.

14. The apparatus according to claim 8, further comprising:
a covering member disposed so as to overlie the interlayer insulating layer together with the pixel electrode.

15. The apparatus according to claim 11, further comprising:
a covering member disposed so as to overlie the interlayer insulating layer together with the pixel electrode.

16. The apparatus according to claim 1, wherein the semiconductor layer comprises amorphous silicon and the impurity semiconductor layer comprises n-type amorphous silicon.

17. The apparatus according to claim 16, wherein the converting element further includes a counter electrode disposed opposite the pixel electrode and another impurity semiconductor layer disposed between the semiconductor layer and the counter electrode, and the other impurity semiconductor layer comprises p-type amorphous silicon.

18. A detecting system comprising:
the detecting apparatus according to claim 1;
a signal processing unit configured to process a signal from the detecting apparatus;
a recording unit configured to record a signal from the signal processing unit;
a display unit configured to display the signal from the signal processing unit; and
a transmission unit configured to transmit the signal from the signal processing unit.

19. The system according to claim 18, further comprising:
a radiation source configured to emit radiation to the detecting apparatus.

* * * * *